United States Patent

Miranda et al.

[11] Patent Number: 5,854,559
[45] Date of Patent: Dec. 29, 1998

[54] METHOD AND APPARATUS FOR TESTING MICROWAVE DEVICES AND CIRCUITS IN A CONTROLLED ENVIRONMENT

[75] Inventors: Felix A. Miranda, Olmsted Falls, Ohio; Stanley S. Toncich, San Diego, Calif.

[73] Assignee: The United States of America as represented by the Administrator of the National Aeronautics and Space Administration, Washington, D.C.

[21] Appl. No.: 780,093

[22] Filed: Nov. 20, 1996

[51] Int. Cl.$^6$ .................................................. G01R 31/02
[52] U.S. Cl. ........................................ 324/754; 324/158.1
[58] Field of Search ................................ 324/754, 158.1, 324/74, 601; 73/865.6

[56] References Cited

U.S. PATENT DOCUMENTS

| | | | |
|---|---|---|---|
| 3,553,409 | 1/1971 | Lehrfeld | 200/302.1 |
| 4,535,307 | 8/1985 | Tsukii | 333/35 |
| 4,808,919 | 2/1989 | Sylviane et al. | 324/537 |
| 4,851,764 | 7/1989 | Usui | 324/755 |
| 4,959,614 | 9/1990 | Bowling, et al. | 324/636 |
| 4,980,636 | 12/1990 | Romanofsky | 324/754 |
| 4,982,164 | 1/1991 | Schiek, et al. | 324/638 |
| 5,038,100 | 8/1991 | Kushner, et al. | 324/754 |
| 5,052,183 | 10/1991 | Koscica, et al. | 62/51.1 |
| 5,077,523 | 12/1991 | Blanz | 324/760 |
| 5,097,207 | 3/1992 | Blanz | 324/760 |
| 5,420,506 | 5/1995 | Lin | 324/158.1 |
| 5,477,137 | 12/1995 | Staudinger et al. | 324/158.1 |
| 5,552,714 | 9/1996 | Adamian et al. | 324/601 |

OTHER PUBLICATIONS

Hietala et al, "Network Analyzer Calibration for Cryogenic On–Wafer Measurements," 43rd ARFTG Conference Digest, May 1994, pp. 24–33.

Taub et al, "Cryogenic Probe Station for use in Automated Microwave and Noise Figure Measurements," NASA Technical Memorandum 106560, May 1994, pp. 1–9.

Mejia et al, "A Single–Block TRL Test Fixture for the Cryogenic Characterization of Planar Microwave Components," Advances in Cryogenic Engineering, vol. 41, 1996 (month unavailable), pp. 1731–1738.

Smuk et al, "S–Parameter Characterization and Modeling of Three–Terminal Semiconductive Devices at Cryogenic Temperatures," IEEE Microwave and Guided Wave Letters, vol. 2, No. 3, Mar. 1992, pp. 111–113.

Gronau, "Scattering–Parameter Measurement of Microstrip Devices," Microwave Journal, Nov. 1992, pp. 82, 84, 86 and 89–92.

van Zyl et al, "A Simplified Calibration Procedure for Cryogenic Microwave Measurements," IEEE MTT–S Digest, 1996 (month unavailable), pp. 1403–1406.

*Primary Examiner*—Josie Ballato
*Assistant Examiner*—Russell M. Kobert
*Attorney, Agent, or Firm*—Kent N. Stone; Susan D. Reinecke

[57] ABSTRACT

A test system is disclosed that enables the testing of microwave components in a controlled environment without disturbing that environment. The system includes a test fixture which holds the calibration standards and the component being tested, and environmental control chamber, and a microwave switching system. The system provides a coaxial connection to microwave testing equipment, such as an automatic network analyzer (ANA) and facilitates both calibration and testing while maintaining environmental integrity.

42 Claims, 7 Drawing Sheets

METHOD AND APPARATUS FOR TESTING MICROWAVE DEVICES AND CIRCUITS IN A CONTROLLED ENVIRONMENT

ORIGIN OF THE INVENTION

The invention described herein was made in-part by an employee of the United States Government and may be manufactured and used for the Government for government purposes without the payment of any royalties thereon or therefore.

BACKGROUND OF THE INVENTION

1. Field of the Invention

This invention relates to the area of testing of electronic components at microwave frequencies, wherein the testing involves not only the measurement of the component but the calibration of the test equipment as well. More particularly, this invention relates to the testing of planar microwave components in a controlled environment. The use of this invention enables both the measurement of the component and the calibration of the test equipment without disturbing the controlled testing environment.

Testing of electronic microwave components in a non-controlled environment is well-known in the art. Test equipment such as: vector network analyzers are typically used. Vector network analyzers perform ratiometric measurements of electromagnetic waves propagating through a waveguide and obtain the characteristic scattering or S-parameters. Before any measurement can be made, the test equipment must be calibrated to establish reference planes within the component being tested. This procedure includes the step of calibrating the test equipment which is done using any one of many well-known calibration routines such as Split-Block TRL (thru-reflect-line), and SOLT (short-open-load-thru), among others. These routines use the measured parameters of several known standard components to perform the calibration.

However, if the testing requires the use of a controlled environment, as is the case when the temperature or atmosphere is to be altered, accurate calibration and measurement becomes difficult. For calibration to be accurate, it must be done under the same conditions as the testing. Controlled environments, such as those at cryogenic temperatures, require long evacuation and cooling cycles to establish. Methods such as: Split-Block TRL and SOLT require that the controlled environment be disturbed each time a calibration standard or component is to be tested. In addition to being cumbersome, the long delays between the successive measurements invalidates the calibration and causes errors in testing. Systems such as cryogenic probe systems have been developed to overcome these difficulties. These use microwave probes, positioned within the cryogenic environment to contact the calibration standards and the component being measured. Since the standards and component can all be loaded within the controlled environment and can all be successively accessed with the probes, fast and accurate measurement is possible. However, these systems require that the components being tested have the proper probe contacts, which is often not the case. These systems also require environmental control chambers large enough to facilitate the probes and their movement. This in turn increases cooling time and thus measurement time.

2. Description of the Prior Art

The relevant prior art can be grouped into three basic categories: test fixtures, cryogenic test systems, and on-wafer cryogenic test systems. U.S. Patents to Romanofsky et al. (U.S. Pat. No. 4,980,636) and Kushner et al. (U.S. Pat. No. 5,038,100) describe test fixtures for use in characterizing microwave components. Romanofsky et al. discloses an MMIC test fixture which facilitates testing of the MMIC, and calibration of the test equipment through sequentially interchanging and measuring calibration standards and the MMIC within the fixture. It couples RF energy to the component via a waveguide. Kushner et al. also discloses a fixture that facilitates calibration and testing through sequentially interchanging and measuring calibration standards and the component within the fixture. In the Kushner et al. patent, calibration standards and components are interchanged and measured sequentially. RF energy is coupled to the component and calibration standards via a coaxial connection and the components and standards are held in the fixture using a spring-loaded mechanism. U.S. Patent to Koscica et al. (U.S. Pat. No. 5,052,183) discloses a method for characterizing microwave components at cryogenic temperatures wherein the components are immersed in liquid nitrogen and the RF energy is coupled to the components through the use of waveguides. Techniques for cryogenic characterization of microwave components in a gaseous environment are described by Smuk et al. ("S-Parameter Characterization and Modeling of Three-Terminal Semiconductive Devices at Cryogenic Temperature", IEEE Microwave and Guided Wave Letters, Vol. 2, No. 3, March 1992, pp. 111–113) and by J. E. van Zyl et al. ("A Simplified Calibration Procedure for Cryogenic Microwave Measurements", 1996 MTT-S Digest, pp. 1403–1406). The Smuk et al. reference discloses a method for cryogenic testing that utilizes a split-block TRL calibration technique. The van Zyl et al. paper describes a cryogenic test system that utilizes time-domain reflectometry. On-wafer cryogenic test systems are described in Blanz (U.S. Pat. No. 5,097,207 and U.S. Pat. No. 5,077,523) and in Taub et al. ("Cryogenic Probe Station for use in Automated Microwave and Noise Figure Measurements", NASA Technical Memorandum 106560). In these systems components and calibration standards are coupled to the test system directly using microwave probes.

SUMMARY OF THE INVENTION

A system for measuring planar microwave components in a controlled environment is presented. The system is designed such that calibration of the test equipment and testing of a component can be accomplished without disturbing the controlled environment. The system includes a test fixture, environmental control chamber and an electronic switching system.

The test fixture houses both the calibration standards and the component that is to be tested on a single block. The component being tested is mounted between two microwave connecting lines and electrically connected to the lines. The calibration standards and the microwave connecting lines are connected to coaxial connectors which are mounted in the walls of the test fixture. The test fixture is then mounted in an environmental control chamber. This chamber can be used to establish and maintain a controlled environment such as: vacuum, cryogenic temperatures, high-temperature and one containing various gasses. The chamber also provides a means for coupling RF energy between the test fixture mounted inside it and a piece of test equipment. Electrical connection of the testing apparatus and the calibration standards and the component being tested is accomplished through semi-rigid coaxial cables coupled through the walls of the environmental control chamber. Each cable is connected to one of the coaxial connectors in the test fixture. The test equipment can then be calibrated by measuring the calibration standards and using calibration routines that are well-known in the art. Electrical connection between the test equipment and the calibration standards and the component being tested is accomplished externally without disturbing the testing environment. Connection of the test equipment to the individual calibration standards and the component being tested can be accomplished manually or through the use of an electronic switching system.

It is an object of the invention to provide a fast and accurate method and apparatus for the characterization of planar microwave components within a controlled environment.

It is a further object of the invention to provide a method and apparatus for testing microwave components, wherein calibration of the testing equipment and the testing itself can be accomplished without the disruption of the controlled environment.

It is a further object of the invention to provide a method and apparatus for testing microwave components in a controlled environment that is fast, accurate, and simple and does not require the component under test to have special features such as probe pads.

DETAILED DESCRIPTION OF THE PREFERRED EMBODIMENT

Figure 1:
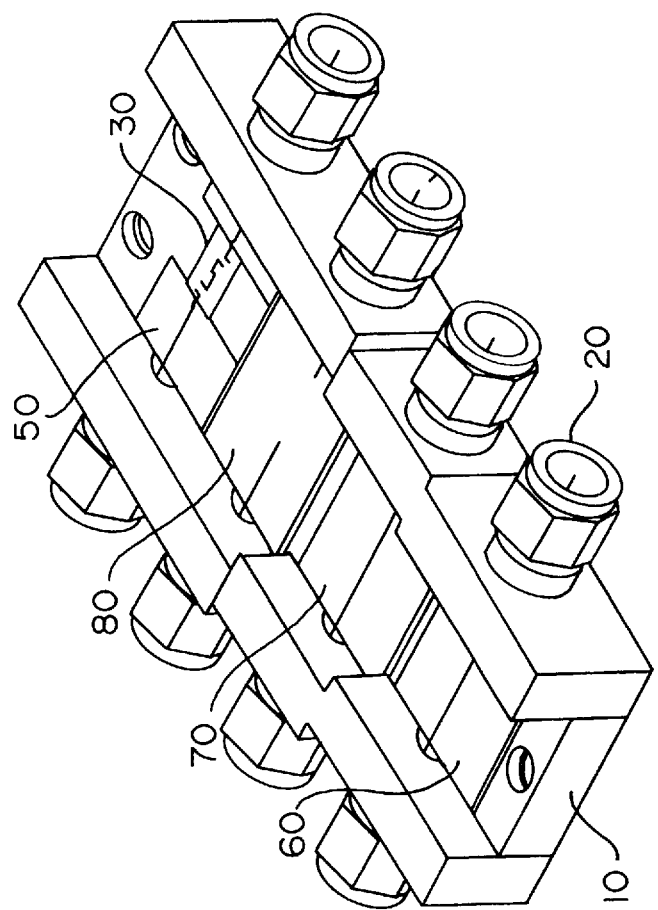
FIG. 1. is an exploded view of the mounting block
Figure 2:
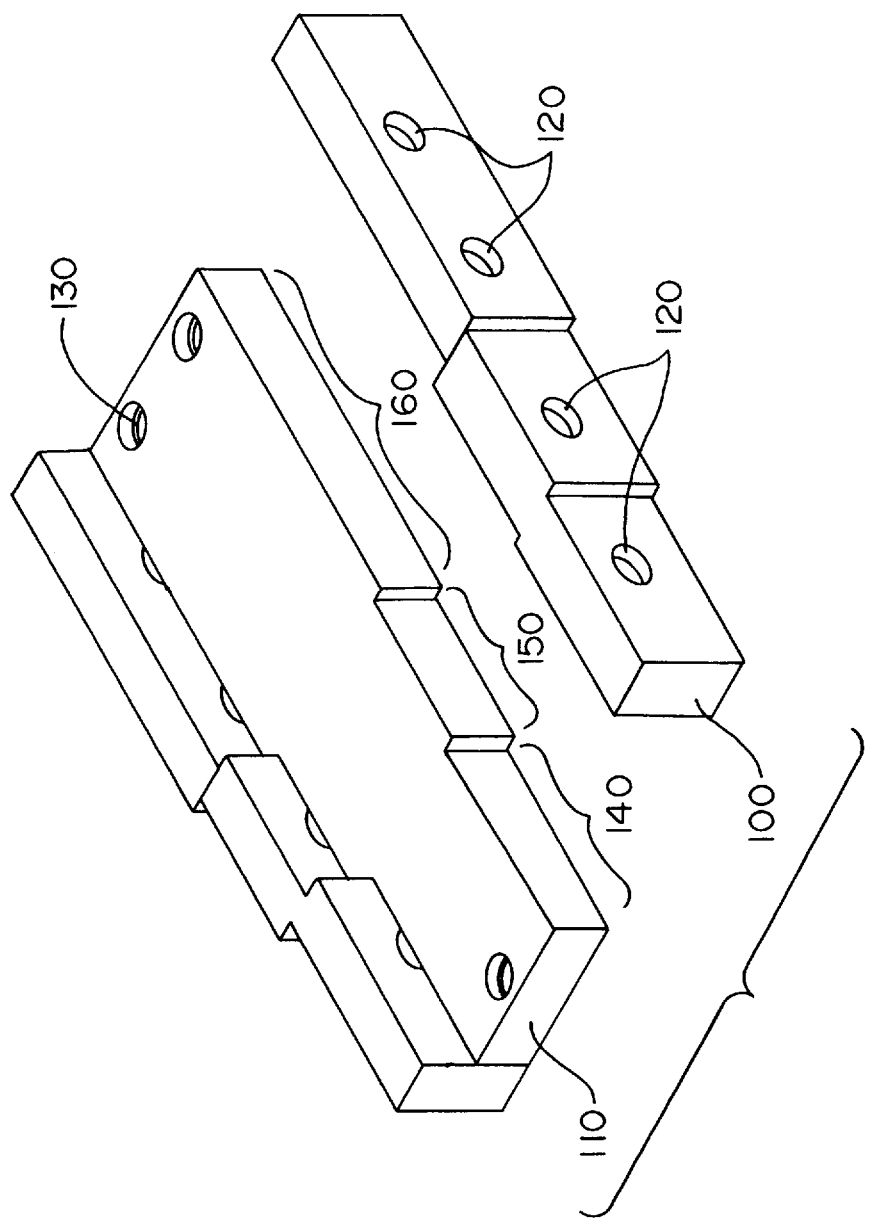
FIG. 2. is a view of the test fixture

In order to measure microwave components in a controlled environment without disturbing the controlled environment, the component to be tested and the calibration standards must be mounted in the controlled environment in such a way that makes it easy to couple RF energy to the component and the calibration standards. This is facilitated by the test fixture shown in FIG. 1. The fixture is comprised of a mounting block 10, which is made of a rigid material. This material is usually a metal such as brass. The mounting block 10 supports the calibration standards 60, 70, 80, the microwave connecting lines 50, and the component 30 being tested. The mounting block 10 as shown in FIG. 2 includes a base plate 110 and side walls 100. The coaxial connectors 20 are mounted in the side walls 100 such that their center conductor extends beyond the inside face of the side walls 100. These connectors can be of SMA or other type depending on the desired testing frequency. The base plate includes at least three areas 140, 150, 160 which support the calibration standards and the component being tested. The exact size and number of these areas will vary depending on the exact calibration method used, the frequencies at which the measurements are being made and the size of the component being tested. In FIG. 1 and FIG. 2, a typical configuration of the test fixture for TRL calibration using microstrip calibration standards is shown. It includes a reflect area 160, which supports the microwave connecting lines 50, the component 30 and the refection calibration standard 80. It also includes a delay area 150 which supports the delay calibration standard 70 and a thru area 140 which supports the thru calibration standard 60. Although the invention is shown in a microstrip embodiment, other planar microwave transmission line structures such as: coplanar-waveguide (CPW), slotline, and stripline could alternately be used. Whatever configuration is used, the length of the conductor must not be a multiple of half a wavelength. This is particularly important in regard to the thru and delay lines. The component 30 being tested is coupled to the microwave connecting lines 50 by wire-bonds. The microwave connecting lines and the calibration standards are coupled to the coaxial connectors by wirebonds which connect the center pin of the coaxial connector to center conductor of the calibration standards and the connecting lines. The test fixture includes holes 130 that are used to mount the test fixture inside the controlled environment by the use of screws or pins.

Figure 3:
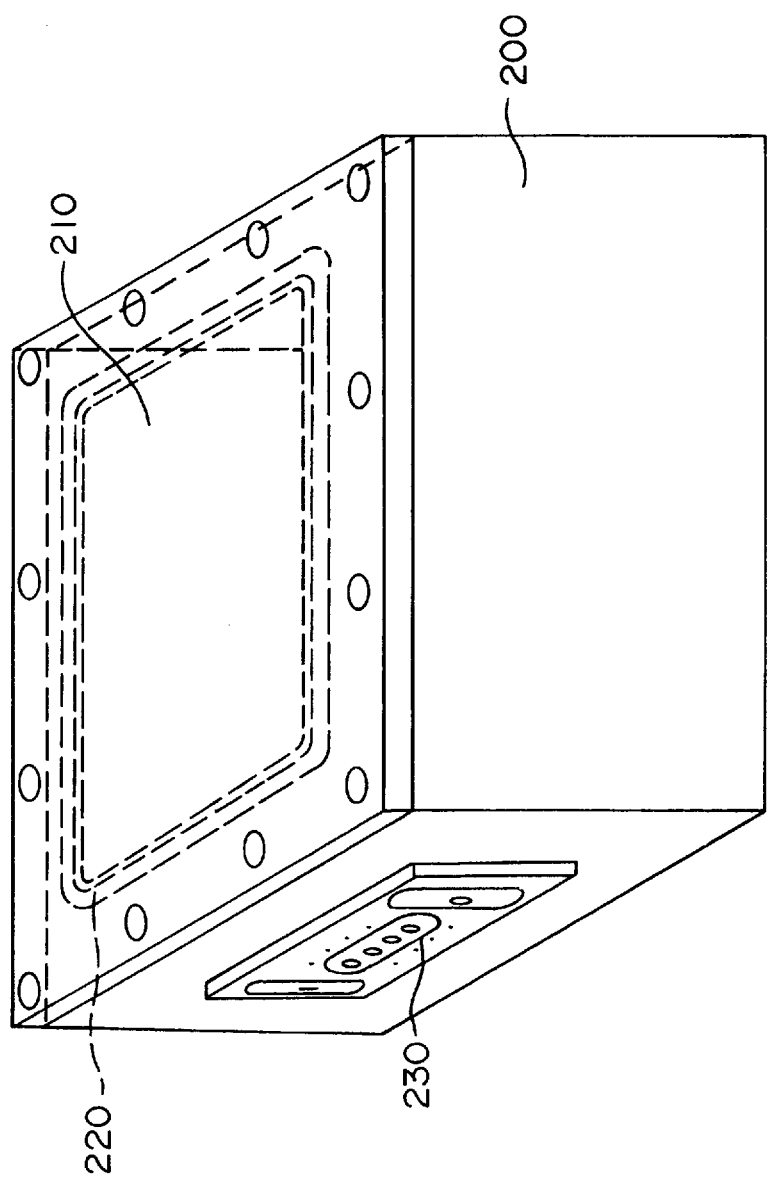
FIG. 3. is a view of the environmental control chamber
Figure 4:
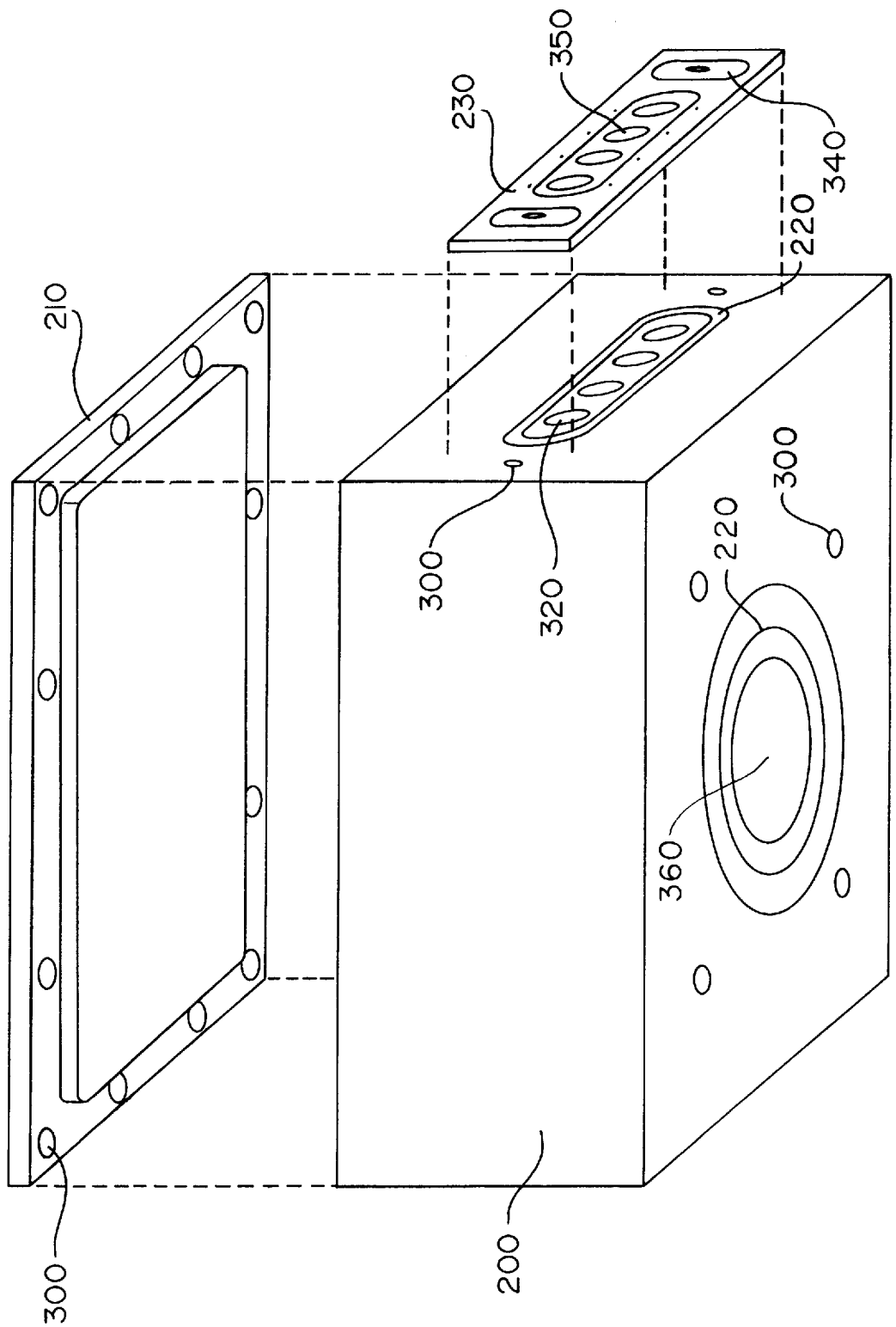
FIG. 4. is an exploded view of the environmental control chamber

In order to test the component in a controlled environment, the test fixture is mounted inside an environmental control chamber which is shown in FIG. 3. This chamber includes a hollow rectangular box 200, a lid 210 and a pair of detachable plates 230 located on opposing walls of the box. The lid 210 can be securely attached to the box to form an air-tight seal. The box includes and O-ring 220 embedded in the top of the box to facilitate this seal. The lid is preferably made from a transparent material as is shown in FIG. 3, like plexiglass. This enables the contents of the box to be viewed during testing. However the lid can alternatively be made of metal. The box, as shown in FIG. 4, is made of metal, preferably aluminum. It includes ports that enable both environmental control and the coupling of microwave energy in and out of the box. This embodiment of the invention has been designed for use in cryogenic testing in that the environmental control port 360 is designed so that it can be mounted on the external shield of a closed-cycle helium gas refrigerator while allowing direct contact between the second stage's cold finger and the test fixture. The detachable plates 230 include a plurality of secondary feed-thru ports 350 to accommodate the coaxial cables necessary for coupling the microwave signal originating in the testing apparatus to the test fixture. The box contains a plurality of primary feed-thru ports 320 located in its shorter opposing sides. The primary feed-thru ports of the box are aligned with the secondary feed-thru ports of the detachable plates, and are spaced to equal the spacing between the coaxial connectors of the test fixture. Vacuum integrity is maintained between the box and the plates and the cold-head by the use of O-rings 220 embedded in the box. The plates and the cold-finger are attached to the box by the use of screws. The plates include expanded holes 340 so that the when the plate is secured to the box, the holes in the plates can be aligned properly with those in the box 300.

Figure 5:
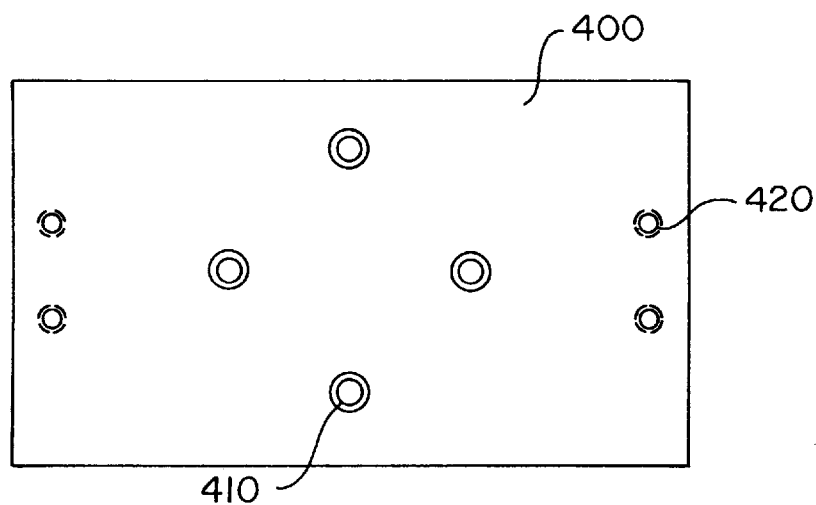
FIG. 5. is a view of the brass plate

The cold-finger of the closed-cycle refrigerator is attached to the test fixture through the use of a plate shown in FIG. 5. This plate is made of brass or some other material that facilitates efficient thermal transfer. The brass plate includes a series of holes 410 in a circular configuration that, through the use of screws or pins, secure the cold-finger. A second plurality of holes 420 on the outer edges of the plate accommodate the screws that attach the test fixture.

Figure 6:
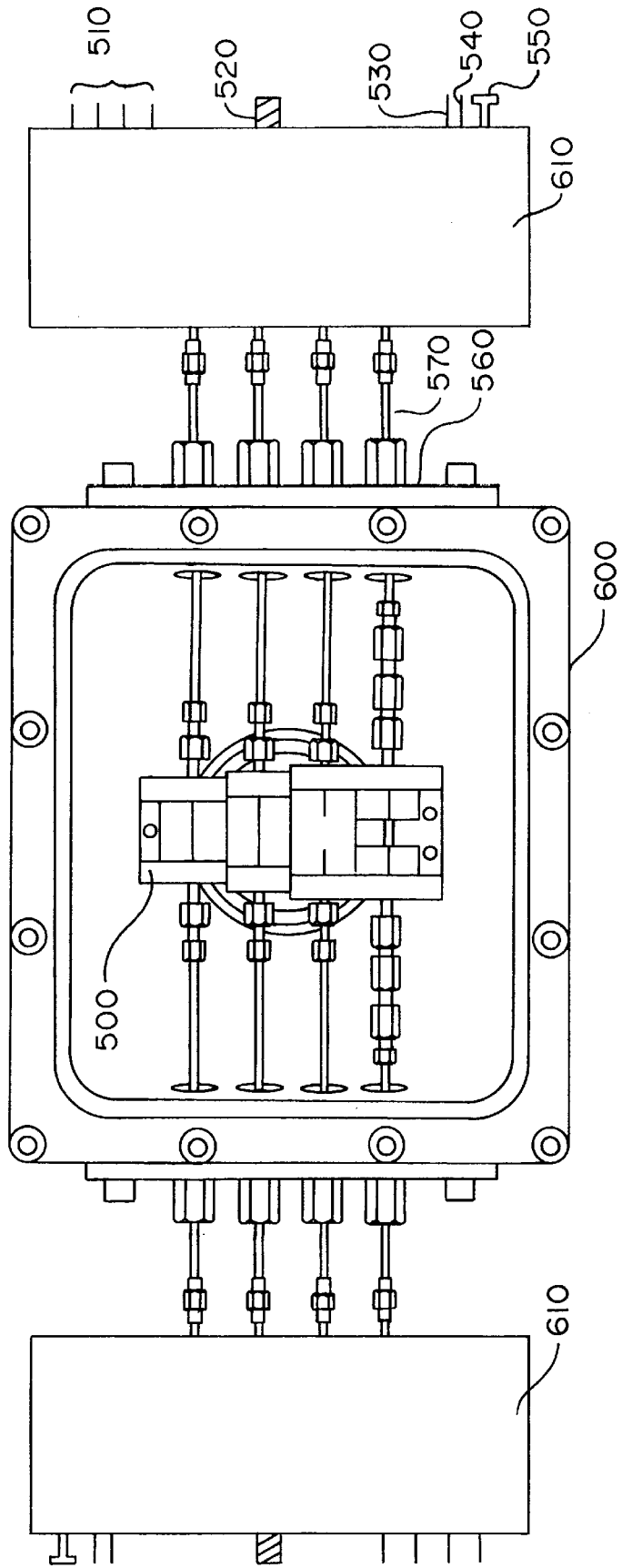
FIG. 6. is a top view of the test fixture mounted in the environmental control chamber FIG. 7. is a block diagram of an embodiment of the system configured for use in cryogenic testing.

FIG. 6 shows the test fixture 500 mounted in the environmental control chamber 600. A plurality of coaxial cables 570 are fed through the walls of the chamber through feed-thrus 560 that are mounted inside the primary and secondary feed-thru ports in the box and the plates respectively. For use in cryogenic testing or any other environment requiring a vacuum, the coaxial cables contain a non-air dielectric such as: Teflon (PTFE). In order to electrically connect to the testing apparatus, the coaxial cables can be manually coupled to cables leading to the testing apparatus, in a sequential fashion as calibration and testing demands. Alternatively, the coaxial cables can be electrically connected to a pair of switching devices 610 that are connected electrically to the testing apparatus via a testing apparatus coaxial port 520. The switching devices have a ground port 550, a +5 volt terminal 530, and a −5 volt terminal 540. They also contains a plurality of switch bias pins 510, each of which correspond to an internal electronic switch. Each electronic switch corresponds to a single coaxial connector. In order to open a switch corresponding to a specific coaxial connector, the switch must be biased. When the switch is biased, the microwave signal originating at the testing apparatus will flow through the corresponding calibration standard or the component being tested. Biasing is achieved by connecting the ground port of the switching device on one side of the standard or component being tested to the switch bias pin corresponding to the proper coaxial cable and connecting the +5 or −5 volt terminal to the corresponding switch bias pin on the other side. By changing the bias on the switching device, calibration and testing can be achieved without disturbing the physical connections of the system. This increases the accuracy of the test being performed.

Figure 7:
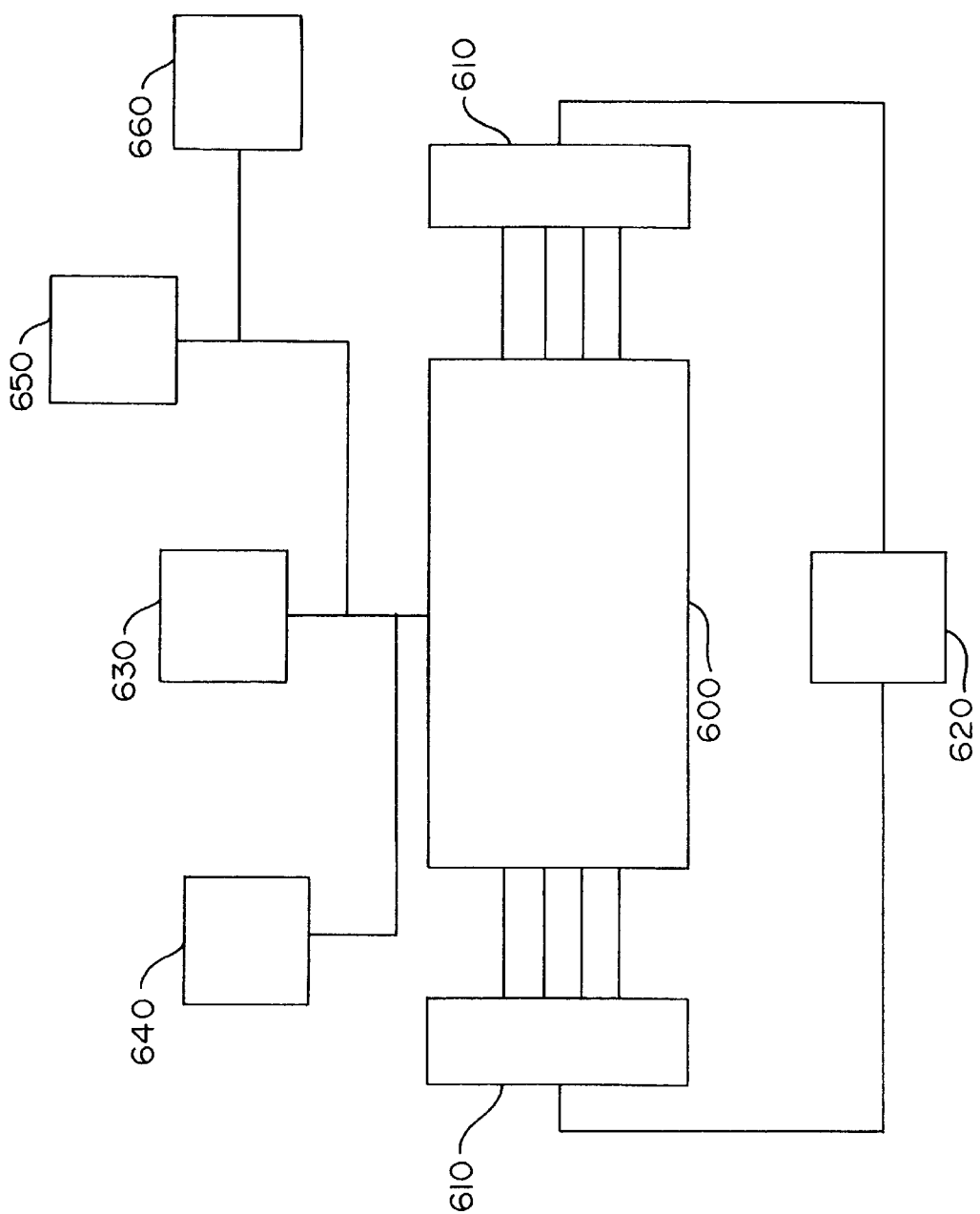

A block diagram of a typical configuration of the testing system for use in cryogenic testing is shown in FIG. 7. The environmental control chamber 600 is connected to the pair of switching devices. These devices are electrically connected to the testing apparatus 620, such as an ANA. A closed-cycle refrigerator 630 is connected to the environmental control port of the chamber 600. A vacuum pump 650 and gauge 660, needed to establish a vacuum necessary for the cryogenic environment are attached to the refrigerator. A temperature controller 640 measures and stabilizes the temperature of the chamber by controlling a coil resistor mounted underneath the cold finger of the refrigerator. The temperature controller measures the temperature of the chamber through the use of two silicon diode sensors. One sensor is mounted underneath the cold finger and the other is mounted on the test fixture.

Although the present invention has been described in terms of the presently preferred embodiment, it is to be understood that such disclosure is not to be interpreted as limiting. Various alterations and modifications will no doubt become apparent to those skilled in the art after reading the above disclosure. For instance, the disclosed system could be used to measure microwave components at elevated as well as cryogenic temperatures. The system could also be used to measure components in a gaseous environment. Accordingly, it is intended that the appended claims be interpreted as covering all alterations and modifications as fall within the true spirit and scope of the invention.

What is claimed is:

1. A test fixture for use in characterizing planar microwave components in a controlled environment without disturbing the controlled environment during testing, wherein said fixture comprises:

a mounting block;

a pair of planar microwave connecting lines each having a first and second end, mounted on said mounting block and wherein the first end of said connecting lines are to be connected electrically to the component;

a plurality of planar microwave calibration standards mounted on said mounting block; and a plurality of coaxial connectors mounted on said mounting block wherein said coaxial connectors are electrically connected to the second ends of said pair of connecting lines and to said plurality of calibration standards.

2. A test fixture as claimed in claim 1 wherein said mounting block comprises:

a means for mounting said calibration standards, said connecting lines and the component;

a means for mounting said coaxial connectors; and a means for attaching said mounting block to the controlled environment.

3. A test fixture as claimed in claim 2 wherein the material of said mounting block is a metal.

4. A test fixture as claimed in claim 3 wherein the material of said mounting block is brass.

5. A test fixture as claimed in claim 3 wherein said means for mounting said calibration standards, said connecting lines and the component comprises a horizontal base plate which includes a flat top surface, and a plurality of side edges, wherein side edges are parallel to each other.

6. A test fixture as claimed in claim 5 wherein said base plate is symmetric about one axis, and said side edges are parallel to said axis, further comprising:

a reflect area including two (2) of said plurality of side edges, at least one delay area including two (2) of said plurality of side edges, located next to said reflect area, and a thru area including two (2) of said plurality of side edges, located next to said delay area.

7. A test fixture as claimed in claim 6 wherein the means for mounting said coaxial connectors comprises a plurality of side walls permanently fixed to and extending upward from said plurality of side edges of said base plate which include a plurality of connector holes wherein the length of said plurality of holes is parallel to said base plate.

8. A test fixture as claimed in claim 7 wherein the number of holes in said plurality of holes is equal to the number of said plurality of coaxial connectors.

9. A test fixture as claimed in claim 3, wherein said means for attaching said mounting block to the controlled environment comprises a plurality of screws inserted through and extending beyond said base plate.

10. A microwave measurement system as claimed in claim 3 wherein means for electrically connecting said chamber to said means for measuring microwave characteristics is a microwave switch, wherein said switch electrically connects each of said plurality of second coaxial cables individually with said means for measuring microwave characteristics.

11. A microwave measurement system as claimed in claim 10, wherein said microwave switch comprises a plurality of coaxial ports spaced a distance apart equal to the distance of spacing between said plurality of second coaxial cables.

12. A test fixture as claimed in claim 1, wherein said plurality of coaxial connectors are SMA.

13. A test fixture as claimed in claim 1, wherein said planar connecting lines and said planar calibration standards comprise:

a dielectric, at least one (1) conductor, and at least one ground plane.

14. A test fixture as claimed in claim 13, wherein said dielectric, said conductor and said ground plane form a microwave transmission line of the type selected from the group comprising: coplanar waveguide, microstrip, slotline and stripline.

15. A test fixture as claimed in claim 14, wherein said transmission lines are connected electrically to said plurality of coaxial connectors using wire bonds.

16. A test fixture as claimed in claim 14, wherein said transmission lines have a characteristic impedance of 50Ω.

17. A test fixture as claimed in claim 16, wherein said dielectric has a relative dielectric constant of approximately 9.0 and wherein said conductor and said ground plane are metal.

18. A test fixture as claimed in claim 17, wherein said dielectric is alumina and said conductor and said ground plane are gold.

19. A test fixture as claimed in claim 18, wherein the thickness of said alumina is 0.010 inches.

20. A test fixture as claimed in claim 1, wherein said plurality of calibration standards are TRL calibration standards.

21. A test fixture as claimed in claim 20, wherein said plurality of TRL calibration standards comprise:
    a thru line,
    at least one delay line, and
    a pair of reflect lines.

22. A test fixture as claimed in claim 21, wherein said pair of reflect lines are selected from the group comprising: open lines and short lines.

23. A test fixture as claimed in claim 1, wherein said plurality of calibration standards are SOLT calibration standards.

24. A method for measuring planar microwave components in a controlled environment without disturbing the controlled environment, comprising:
    mounting the component in a test fixture for use in characterizing planar microwave components in a controlled environment without disturbing the controlled environment during testing, wherein said fixture comprises:
        a mounting block;
        a pair of planar microwave connecting lines each having a first and second end, mounted on said mounting block and wherein the first end of said connecting lines are to be connected electrically to the component;
        a plurality of planar microwave calibration standards mounted on said mounting block; and
        a plurality of coaxial connectors mounted on said mounting block wherein said coaxial connectors are electrically connected to the second ends of said pair of connecting lines and to said plurality of calibration standards;
    electrically connecting the terminals of the component to the first ends of said connecting lines;
    placing said test fixture in an environmental control chamber, wherein said environmental control chamber includes a plurality of electrical feed-thrus each with a first coaxial terminal located within said chamber and a second coaxial terminal located outside said chamber;
    electrically connecting a pair of said plurality of first coaxial terminals to said pair of component connectors thereby forming a pair of component test terminals and electrically connecting the remainder of said plurality of coaxial first terminals to said calibration connectors to form a plurality of pairs of calibration terminals;
    establishing the controlled environment;
    calibrating a microwave testing apparatus, the steps of which consists of:
        preloading the microwave testing apparatus with a calibration routine,
        connecting said testing apparatus to each of said pairs of calibration terminals electrically, in sequence,
        measuring the S-parameters of each of the calibration standards,
        calculating calibration coefficients from said scattering (S) parameters using said calibration routine; and
        testing the component by electrically connecting said testing apparatus to said pair of component test terminals.

25. A method as claimed in claim 24, wherein said calibration standards are TRL calibration standards and the calibration routine is a TRL calibration routine.

26. A method as claimed in claim 24, wherein said calibration standards are SOLT calibration standards and the calibration routine is a SOLT calibration routine.

27. A method as claimed in claim 24, wherein the controlled environment is cryogenic.

28. A method as claimed in claim 24, wherein the step of connecting said testing apparatus to each of said pairs of calibration terminals electrically, in sequence and the step of testing the component by electrically connecting said testing apparatus to said pair of component test terminals are accomplished by electronic switching.

29. A microwave measurement system for use in characterizing planar microwave components in a controlled environment without disturbing the controlled environment during testing, wherein said system comprises:
    means for measuring microwave characteristics of the microwave components;
    an environmental control chamber containing a plurality of coaxial cables, electrically connected to said means for measuring microwave characteristics;
    a means for electrically connecting said chamber to said means for measuring microwave characteristics;
    means for controlling the environment within said chamber and connected to said chamber; and
    a test fixture for use in characterizing planar microwave components in a controlled environment without disturbing the controlled environment during testing, wherein said fixture comprises:
        a mounting block;
        a pair of planar microwave connecting lines each having a first and second end, mounted on said mounting block and wherein the first end of said connecting lines are to be connected electrically to the component;
        a plurality of planar microwave calibration standards mounted on said mounting block; and
        a plurality of coaxial connectors mounted on said mounting block wherein said coaxial connectors are electrically connected to the second ends of said pair of connecting lines and to said plurality of calibration standards; said test fixture located within said chamber wherein each of said plurality of coaxial connectors is electrically connected to one of said plurality of coaxial cables.

30. A microwave measurement system as claimed in claim 29, wherein said means for controlling the environment within said chamber is a means for controlling the gasses within said chamber.

31. A microwave measurement system as claimed in claim 29, wherein said means for measuring microwave characteristics is a means for measuring S-parameters.

32. A microwave measurement system as claimed in claim 29, wherein said means for measuring microwave characteristics is a means for measuring noise figure.

33. A microwave measurement system as claimed in claim 29, wherein said means for measuring microwave characteristics is a means for measuring microwave power.

34. A microwave measurement system as claimed in claim 29, wherein said environmental control chamber further comprises:
a hollow rectangular box;
a rectangular lid wherein said lid is secured to the top of said box;
a brass plate, located within said rectangular box which couples said test fixture to said means for establishing the controlled environment;
a pair of detachable plates fixed securely to the sides of said rectangular box, wherein said pair of plates contain a first plurality of feed-thru ports through which the plurality of second coaxial cables are coupled through.

35. A microwave measurement system as claimed in claim 34, wherein said hollow rectangular box further comprises:
a bottom plate comprising a pair of short ends and a pair of long ends and a environmental control port;
a pair of short sidewalls extending upward from said pair of short ends and each containing a second plurality of feed-thru ports;
a pair of long sidewalls extending upward from said pair of short ends and fixed to said pair of short sidewalls;
a first O-ring, embedded in the top of said pair of short sidewalls and the top of said pair of long sidewalls;
a pair of second O-rings, wherein each of said second O-rings are embedded in said short sidewalls surrounding said feed-thru ports.

36. A microwave measurement system as claimed in claim 29, wherein said means for controlling the environment within said chamber is a means for controlling the temperature within said chamber.

37. A microwave measurement system as claimed in claim 36, wherein said means for controlling the temperature within said chamber further comprises:
a means for evacuating said chamber, connected to said chamber; and
a means for cooling said chamber, connected to said chamber.

38. A microwave measurement system as claimed in claim 37, wherein said means for cooling said chamber, is a means for cooling said chamber to cryogenic temperatures.

39. A microwave measurement system as claimed in claim 38, wherein said means for cooling said chamber to cryogenic temperatures further comprises:
a closed-cycle helium gas refrigerator;
a cold finger attached to said refrigerator and fixed to said brass plate, located within said rectangular box;
a compressor, wherein said compressor includes a supply line and a return line which are both connected to said refrigerator;
a temperature controller;
a first temperature sensor attached to said cold finger and said temperature controller;
a second temperature sensor attached to said test fixture and said temperature controller; and
a coil resistor connected to said test fixture and to said temperature controller, wherein said coil resistor is used to supply heat and therefore stabilize the temperature.

40. A microwave measurement system as claimed in claim 39, wherein said brass plate is secured to said cold finger with screws.

41. A microwave measurement system for use in characterizing planar microwave components in a controlled environment without disturbing the controlled environment during testing, wherein said system comprises:
means for measuring microwave characteristics of the microwave components;
an environmental control chamber containing a plurality of second coaxial cables, comprising:
a hollow rectangular box;
a rectangular lid wherein said lid is secured to the top of said box;
a brass plate, located within said rectangular box which couples said test fixture to said means for establishing the controlled environment;
a pair of detachable plates fixed securely to the sides of said rectangular box, wherein said pair of plates contain a first plurality of feed-thru ports through which the plurality of second coaxial cables are coupled through;
a microwave switch, wherein said switch electrically connects each of said plurality of second coaxial cables individually with said means for measuring microwave characteristics for electrically connecting said chamber to said means for measuring microwave characteristics;
a test fixture for use in characterizing planar microwave components in a controlled environment without disturbing the controlled environment during testing, wherein said fixture comprises:
a mounting block;
a pair of planar microwave connecting lines each having a first and second end, mounted on said mounting block and wherein the first end of said connecting lines are to be connected electrically to the component;
a plurality of planar microwave calibration standards mounted on said mounting block; and
a plurality of coaxial connectors mounted on said mounting block wherein said coaxial connectors are electrically connected to the second ends of said pair of connecting lines and to said plurality of calibration standards; said text fixture located within said chamber wherein each of said plurality of coaxial connectors is electrically connected to one of said plurality of second coaxial cables; and
a means for cooling said chamber to cryogenic temperatures, wherein said means for cooling is connected to said chamber and comprises:
said chamber to cryogenic temperatures further comprises:
a closed-cycle helium gas refrigerator;
a cold finger attached to said refrigerator and fixed to said brass plate, located within said rectangular box;
a compressor, wherein said compressor includes a supply line and a return line which are both connected to said refrigerator;
a temperature controller;
a first temperature sensor attached to said cold finger and said temperature controller;
a second temperature sensor attached to said test fixture and said temperature controller;
a coil resistor connected to said test fixture and to said temperature controller, wherein said coil resistor is used to supply heat and therefore stabilize the temperature.

42. A text fixture for use in characterizing planar microwave components in a controlled environment without disturbing the controlled environment during testing, wherein said fixture comprises:
- a brass mounting block comprising:
  - a base plate wherein said base plate is symmetric about one axis and comprises:
    - a plurality of side edges, wherein said edges are parallel to each other and to said axis,
    - a reflect area including two (2) of said plurality of side edges,
    - at least one delay area including two (2) of said plurality of side edges, located next to said reflect area,
    - a thru area including two (2) of said plurality of side edges, located next to said delay area,
  - a plurality of side walls permanently fixed to and extending upward from said plurality of side edges of said base plate which include a plurality of holes wherein the length of said plurality of holes is parallel to said base plate;
- a pair of 50Ω microstrip connecting lines each having a first and second end, mounted on said reflect area of said mounting block, and wherein the first end of said connecting lines are to be connected electrically to the component, wherein said connecting lines comprise a gold conductor, a gold ground plane and an alumina dielectric;
- a plurality of 50Ω microstrip TRL calibration standards mounted on said mounting block, wherein said TRL calibration standards comprise a gold conductor, a gold ground plane and an alumina dielectric, wherein said TRL calibration standards further comprise:
  - a thru line mounted on said thru area of said mounting block,
  - at least one delay line, mounted on said delay area of said mounting block, and
  - a pair of reflect lines, mounted on said reflect area of said mounting block;
- a plurality of SMA coaxial connectors mounted within said mounting block wherein said coaxial connectors are electrically connected to the second ends of said pair of connecting lines and to said plurality of calibration standards using wire bonds, and
- a plurality of screws inserted through and extending beyond said base plate for the purpose of securing said test fixture to the controlled environment.

* * * * *